(12) United States Patent
Lai et al.

(10) Patent No.: US 11,488,829 B1
(45) Date of Patent: Nov. 1, 2022

(54) METHOD OF FORMING A SEMICONDUCTOR DEVICE

(71) Applicant: UNITED MICROELECTRONICS CORP., Hsin-Chu (TW)

(72) Inventors: Kuan-Ying Lai, Chiayi (TW); Hsin-Yu Hsieh, Tainan (TW); Chang-Mao Wang, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/337,457

(22) Filed: Jun. 3, 2021

(30) Foreign Application Priority Data

May 11, 2021 (CN) .......................... 202110509390.5

(51) Int. Cl.
*H01L 21/28* (2006.01)
*H01L 21/3213* (2006.01)
*H01L 29/49* (2006.01)

(52) U.S. Cl.
CPC .. *H01L 21/28088* (2013.01); *H01L 21/32134* (2013.01); *H01L 29/4966* (2013.01)

(58) Field of Classification Search
CPC ......... H01L 21/28088; H01L 21/32134; H01L 29/4966
See application file for complete search history.

(56) References Cited

U.S. PATENT DOCUMENTS

| | | | |
|---|---|---|---|
| 6,967,131 B2 | 11/2005 | Saenger | |
| 7,153,784 B2 | 12/2006 | Brask | |
| 2007/0063296 A1* | 3/2007 | Choi | H01L 21/823842 257/412 |
| 2013/0260549 A1* | 10/2013 | Jagannathan | H01L 21/28088 438/592 |
| 2015/0093891 A1* | 4/2015 | Zope | H01L 21/2855 438/618 |
| 2017/0032977 A1* | 2/2017 | Chen | H01L 23/5226 |

* cited by examiner

*Primary Examiner* — Christine A Enad
(74) *Attorney, Agent, or Firm* — Winston Hsu

(57) ABSTRACT

A method of forming a semiconductor device is disclosed. A substrate having a first device region and a second device region is provided. A metal nitride barrier layer is formed to cover the first device region and the second device region. A titanium layer is deposited on the metal nitride barrier layer. The titanium layer is selectively removed from the second device region, thereby exposing the metal nitride barrier layer in the second device region. The titanium layer in the first device region is transformed into a titanium nitride layer. The titanium nitride layer is a work function layer on the first device region.

9 Claims, 4 Drawing Sheets

METHOD OF FORMING A SEMICONDUCTOR DEVICE

BACKGROUND OF THE INVENTION

1. Field of the Invention

The present invention relates generally to the field of semiconductor technology. More particularly, the present invention relates to a method for forming a semiconductor device.

2. Description of the Prior Art

Advanced complementary metal oxide semiconductor (CMOS) devices may increasingly be utilizing metal gate materials to avoid "poly-Si depletion" and "boron penetration" effects. The selection of a particular metal for a gate material can be guided by a number of considerations, for example, the work function and electrical resistivity desired, the type of gate dielectric, the thermal budget that the gate metal will be expected to survive, etc. In the "dual-metal/dual-work function" CMOS manufacturing method, different gate metals suitable for p-FET (high work function) and for n-FET (low work function) are used.

In general, metal gates for CMOS devises can comprise one or more layers of a pure metal or alloy, a metal or metal alloy silicide, or a metal-containing conductive oxide or nitride, where at least one of these layers is in contact with the device's gate dielectric. A bilayer metal gate might comprise, for example, a thin bottom "cladding" or "work function-setting layer (in contact with an underlying gate dielectric) and a thicker upper "fill layer" to provide good conductivity.

For example, an existing method is to first form a tantalum nitride barrier layer, then deposit a titanium nitride layer on the tantalum nitride barrier layer as a P work function layer, and then cover the PMOS region with a photoresist layer, and then etch the titanium nitride layer in the NMOS region, and then the N work function layer is deposited. However, the disadvantage of the above method is that when the titanium nitride layer in the NMOS region is removed by etching, titanium nitride residues may be generated. In addition, removing the titanium nitride layer in the NMOS region by etching is likely to damage the underlying tantalum nitride barrier layer.

SUMMARY OF THE INVENTION

It is one object of the present invention to provide an improved method of forming a semiconductor device in order to solve the above-mentioned shortcomings or deficiencies of the prior art.

One aspect of the invention provides a method of forming a semiconductor device. A substrate having a first device region and a second device region is provided. A metal nitride barrier layer is deposited to cover the first device region and the second device region. A titanium layer is then deposited on the metal nitride barrier layer. The titanium layer is selectively removed from the second device region, thereby exposing the metal nitride barrier layer in the second device region. The titanium layer in the first device region is then transformed into a titanium nitride layer. The titanium nitride layer is a work function layer on the first device region.

According to some embodiments, the method further includes the steps of forming a dielectric layer on the substrate; and forming a trench in the dielectric layer.

According to some embodiments, the metal nitride barrier layer conformally covers the dielectric layer and an interior surface of the trench.

According to some embodiments, the method further includes the step of forming a high dielectric constant dielectric layer before depositing the metal nitride barrier layer.

According to some embodiments, the first device region is a PMOS region and the second device region is an NMOS region.

According to some embodiments, the titanium layer is selectively removed from the second device region by using diluted HF or hydrogen peroxide-sulfuric acid mixture (SPM).

According to some embodiments, the method further includes the step of depositing an N work function metal layer on the first device region and the second device region after transforming the titanium layer in the first device region into the titanium nitride layer.

According to some embodiments, the N work function metal layer comprises titanium aluminum.

According to some embodiments, the method further includes the step of depositing a gap-filling conductive layer on the N work function metal layer.

According to some embodiments, the gap-filling conductive layer comprises aluminum or tungsten.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
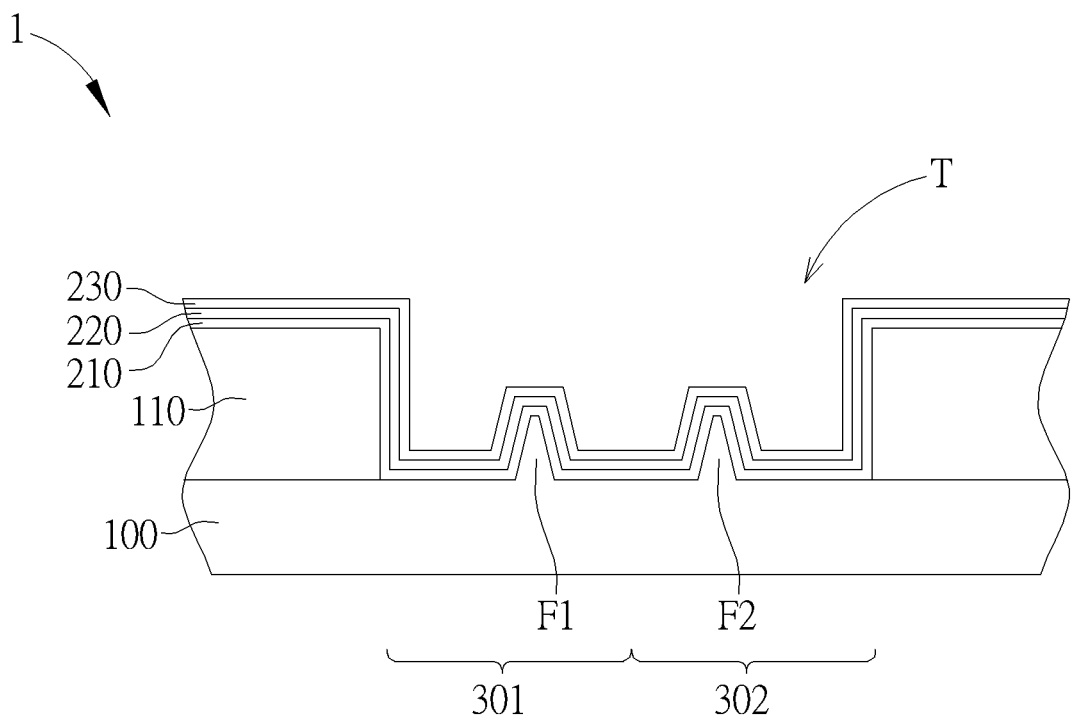
FIG. 1 to FIG. 7 are schematic diagrams of a method for forming a semiconductor device according to an embodiment of the present invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Please refer to FIG. 1 to FIG. 7, which are schematic diagrams of a method for forming a semiconductor device 1 according to an embodiment of the present invention. According to an embodiment of the present invention, the semiconductor device 1 may be a CMOS device. As shown in FIG. 1, first, a substrate 100, such as a silicon substrate, is provided, but it is not limited thereto. The substrate 100 has at least a first device region 301 and a second device region 302. According to an embodiment of the present invention, for example, the first device region 301 is a PMOS region, and the second device region 302 is an NMOS region.

According to an embodiment of the present invention, a dielectric layer 110 is then formed on the substrate 100. The dielectric layer 110 may be a silicon oxide layer, but is not limited thereto. Subsequently, a trench T is formed in the dielectric layer 110. According to an embodiment of the present invention, the substrate 100 may include a fin structure F1 located in the first device region 301 within the trench T, and a fin structure F2 located in the second device region 302 within the trench T.

According to an embodiment of the present invention, a high-k dielectric layer 210 and a metal nitride barrier layer 220 are sequentially deposited by, for example, chemical vapor deposition (CVD) processes to cover the first device region 301 and the second device region 302. The high-k dielectric layer 210 and the metal nitride barrier layer 220 conformally cover the inner surface of the trench T and the top surface of the dielectric layer 110. The high-k dielectric layer 210 may comprise, for example, hafnium oxide, and the metal nitride barrier layer 220 may comprise, for example, tantalum nitride, but is not limited thereto. A titanium layer 230 is then deposited on the metal nitride barrier layer 220.

Figure 2:
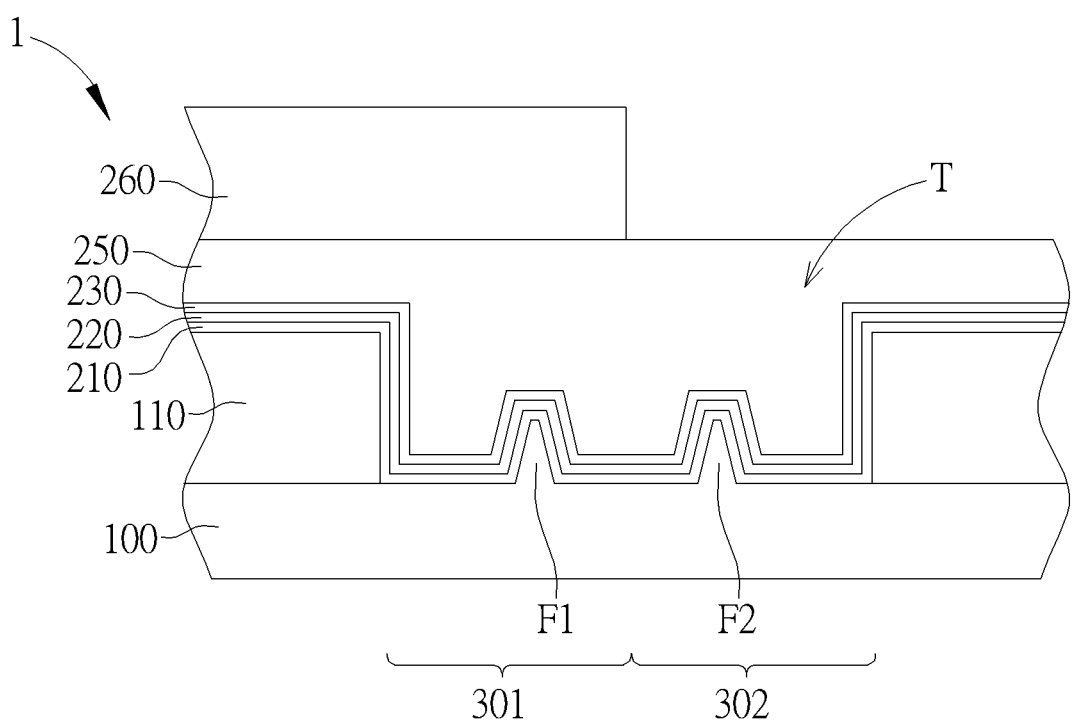

As shown in FIG. 2, a bottom anti-reflection layer 250 is then formed on the substrate 100, and then a photoresist pattern 260 is formed on the bottom anti-reflection layer 250. The photoresist pattern 260 masks the first device region 301.

Figure 3:
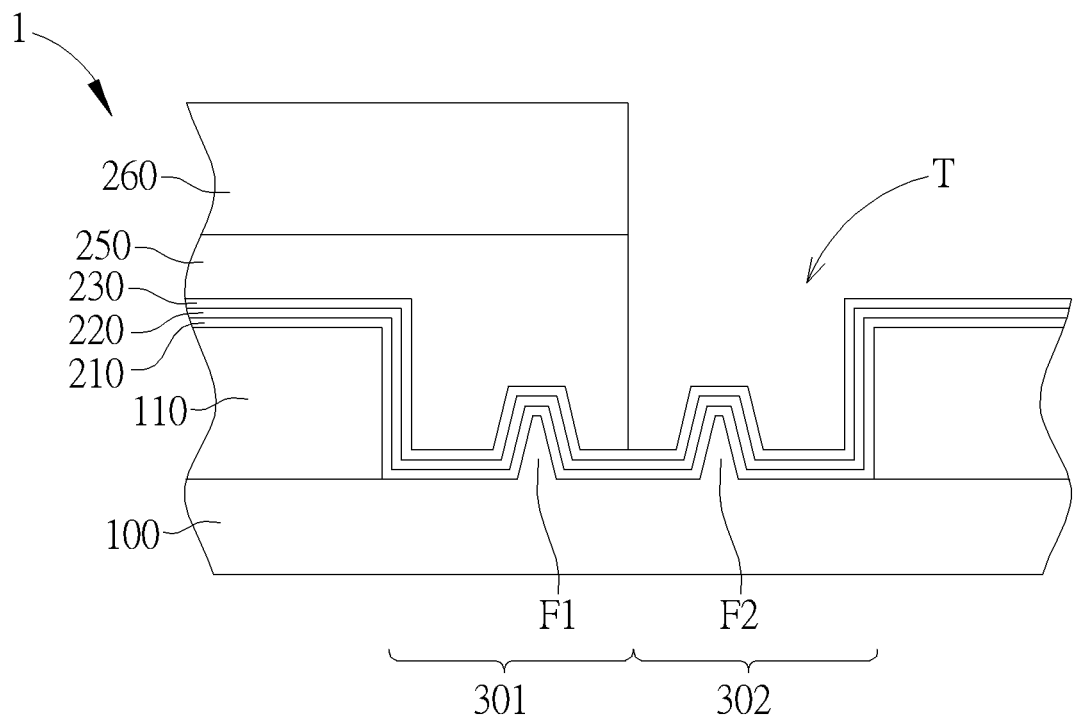

As shown in FIG. 3, the bottom anti-reflection layer 250 that is not covered by the photoresist pattern 260 is then removed, and the titanium layer 230 in the second device region 302 is exposed.

Figure 4:
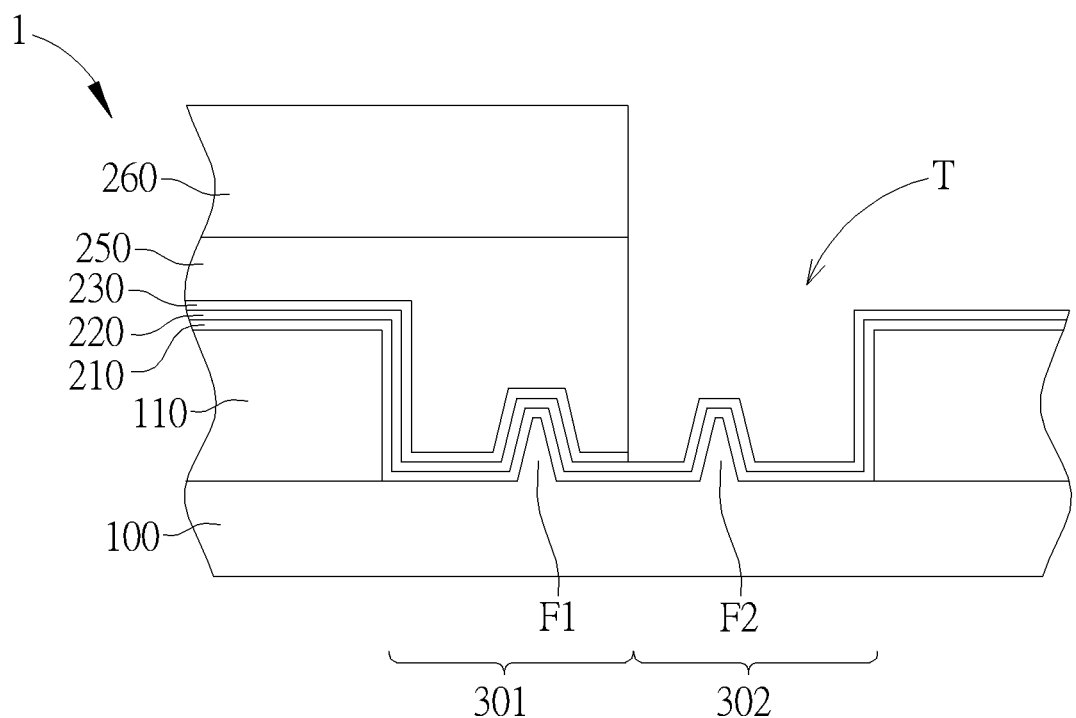

As shown in FIG. 4, an etching process, for example, a wet etching process is used to selectively remove the titanium layer 230 from the second device region 302, thereby exposing the metal nitride barrier layer 220 in the second device region 302. According to an embodiment of the present invention, the aforementioned wet etching process may comprise the use of a diluted hydrofluoric acid solution or a hydrogen peroxide-sulfuric acid mixture (SPM) to selectively remove the titanium layer 230 from the second device region 302.

Since the etching selectivity of titanium to tantalum nitride is higher than that of titanium nitride to tantalum nitride, the metal nitride barrier layer 220 is not easily damaged in this step. In addition, residues are not easily formed.

Figure 5:
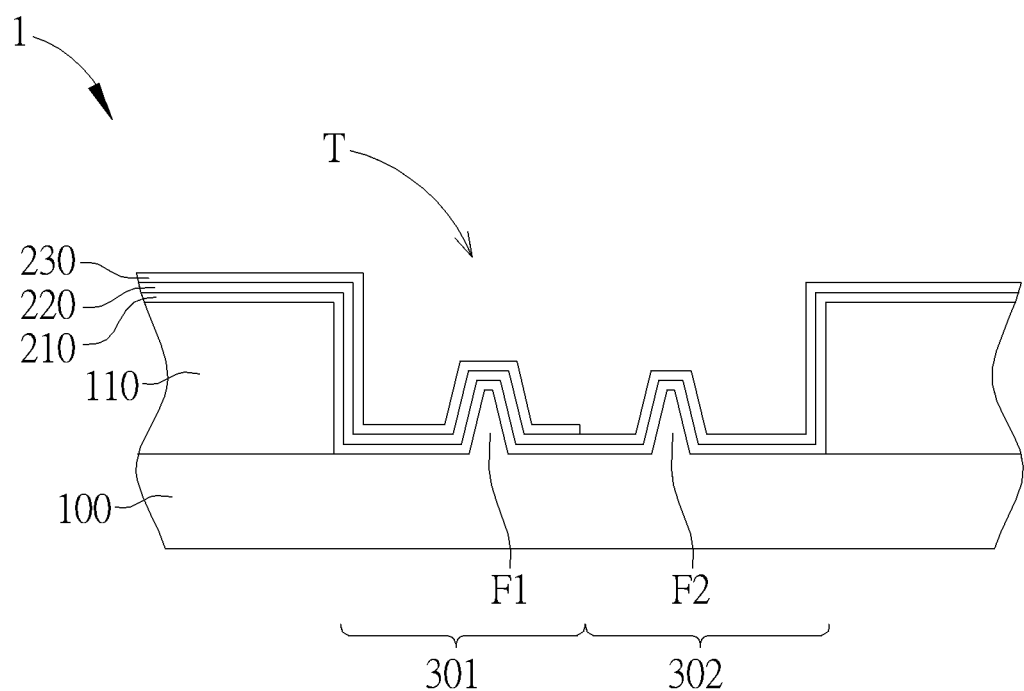

As shown in FIG. 5, the photoresist pattern 260 and the bottom anti-reflection layer 250 are removed, and the titanium layer 230 in the first device region 301 is exposed. Subsequently, the cleaning process can be carried out.

Figure 6:
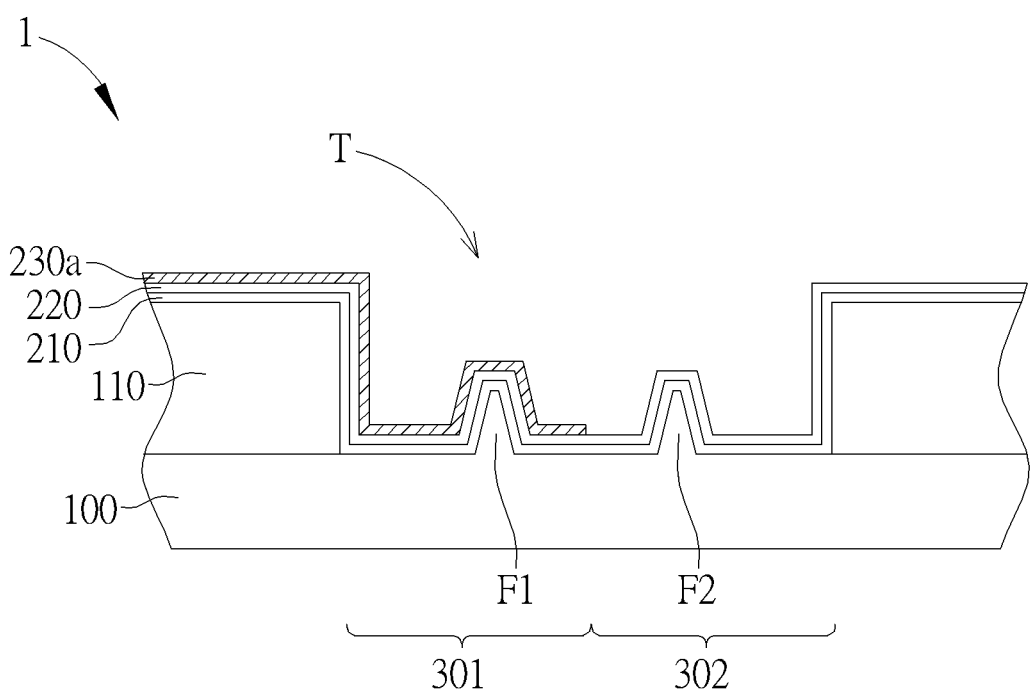

As shown in FIG. 6, the titanium layer 230 in the first device region 301 is then transformed into a titanium nitride layer 230a, which serves as the P work function metal layer in the first device region 301. According to an embodiment of the present invention, for example, nitrogen-containing plasma may be used to transform the titanium layer 230 into the titanium nitride layer 230a.

Figure 7:
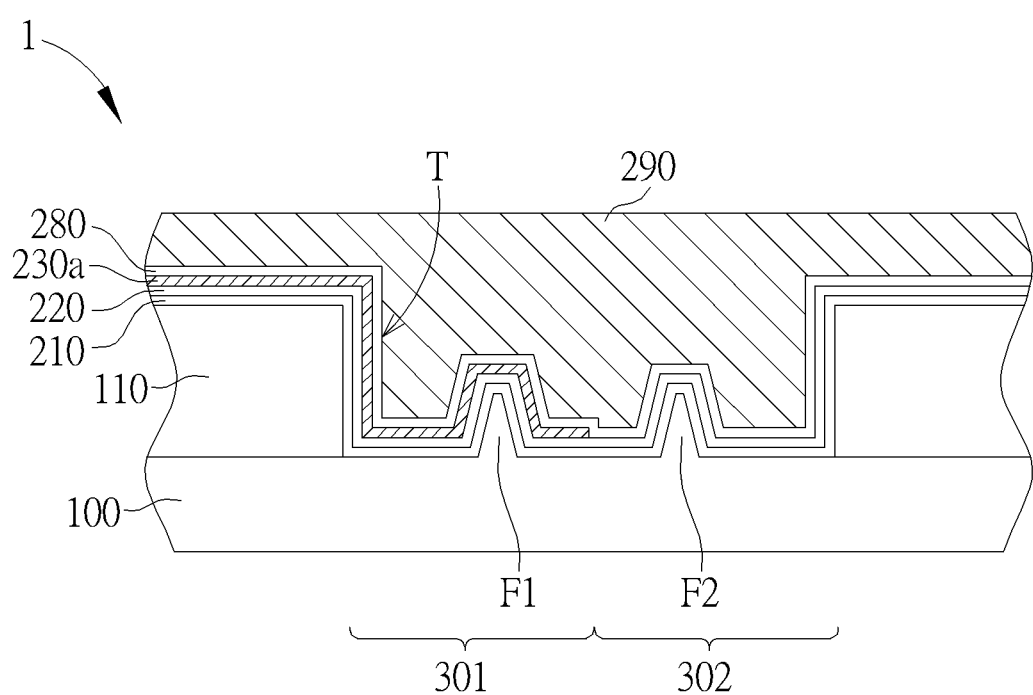

As shown in FIG. 7, next, an N work function metal layer 280 is deposited on the first device region 301 and the second device region 302. According to an embodiment of the present invention, the N work function metal layer 280 may include titanium aluminum, but is not limited thereto. Subsequently, a gap-filling conductive layer 290 is deposited on the N work function metal layer 280. The gap-filling conductive layer 290 may completely fill the trench T. According to an embodiment of the present invention, the gap-filling conductive layer 290 includes aluminum or tungsten.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate having a first device region and a second device region;
   forming a dielectric layer on the substrate;
   forming a trench in the dielectric layer, wherein an interface between the first device region and the second device region is located in the trench;
   depositing a metal nitride barrier layer covering the first device region and the second device region, wherein the metal nitride barrier layer conformally covers the dielectric layer and an interior surface of the trench;
   conformally depositing a titanium layer on the metal nitride barrier layer;
   selectively removing the titanium layer from the second device region, thereby exposing the metal nitride barrier layer in the second device region; and
   transforming the titanium layer in the first device region into a titanium nitride layer, wherein the titanium nitride layer is a work function layer on the first device region.

2. The method according to claim 1 further comprising:
   forming a bottom anti-reflection layer on the substrate, wherein the trench is completely filled with the bottom anti-reflection layer;
   forming a photoresist pattern on the bottom anti-reflection layer, wherein the photoresist pattern masks the first device region and partially overlaps with the trench; and
   removing the bottom anti-reflection layer not covered by the photoresist pattern, thereby exposing the titanium layer in the second device region within the trench.

3. The method according to claim 1 further comprising:
   forming a high dielectric constant dielectric layer before depositing the metal nitride barrier layer.

4. The method according to claim 1, wherein the first device region is a PMOS region and the second device region is an NMOS region.

5. The method according to claim 1, wherein the titanium layer is selectively removed from the second device region by using diluted HF or hydrogen peroxide-sulfuric acid mixture (SPM).

6. The method according to claim 1 further comprising:
   depositing an N work function metal layer on the first device region and the second device region after transforming the titanium layer in the first device region into the titanium nitride layer.

7. The method according to claim 6, wherein the N work function metal layer comprises titanium aluminum.

8. The method according to claim 6 further comprising:
depositing a gap-filling conductive layer on the N work function metal layer.

9. The method according to claim 8, wherein the gap-filling conductive layer comprises aluminum or tungsten.

* * * * *